United States Patent [19]

Hagan et al.

[11] Patent Number: 4,805,556
[45] Date of Patent: Feb. 21, 1989

[54] REACTOR SYSTEM AND METHOD FOR FORMING UNIFORMLY LARGE-DIAMETER POLYCRYSTALLINE RODS BY THE PYROLYSIS OF SILANE

[75] Inventors: David W. Hagan, Circleville, Ohio; William D. Burke, Vancouver, Wash.; Thomas R. Thoman; McRea B. Willmert, both of Moses Lake, Wash.

[73] Assignee: Union Carbide Corporation, Danbury, Conn.

[21] Appl. No.: 144,164

[22] Filed: Jan. 15, 1988

[51] Int. Cl.$^4$ .............................................. C23C 16/00
[52] U.S. Cl. ................................. 118/725; 118/715; 118/719; 422/245
[58] Field of Search ....................... 118/725, 715, 719; 422/245

[56] References Cited

U.S. PATENT DOCUMENTS

| | | | |
|---|---|---|---|
| 3,358,638 | 12/1967 | Rummel | 118/725 |
| 3,463,119 | 8/1969 | Basche | 118/725 |
| 3,523,816 | 8/1970 | Cave | 118/725 |
| 3,918,396 | 11/1975 | Dietze | 118/725 |
| 4,147,814 | 4/1979 | Yatsurugi | 118/725 |
| 4,715,317 | 12/1987 | Ishizuka | 118/725 |
| 4,734,297 | 3/1988 | Jacubert | 427/248.1 |

Primary Examiner—Richard Bueker
Attorney, Agent, or Firm—Morris N. Reinisch

[57] ABSTRACT

This invention relates to the manufacture of high-purity polycrystalline silicon rods by the pyrolysis of silane. More specifically, the present invention relates to an improved method for pyrolyzing monosilane to form high-quality polycrystalline rods of uniform diameter and to an improved pyrolysis reactor system for forming high-quality polycrystalline silicon rods of uniform diameter at high production rates.

6 Claims, 4 Drawing Sheets

REACTOR SYSTEM AND METHOD FOR FORMING UNIFORMLY LARGE-DIAMETER POLYCRYSTALLINE RODS BY THE PYROLYSIS OF SILANE

BACKGROUND OF THE INVENTION

Description of the Prior Art

Polycrystalline silicon rods are used in the manufacture of single crystal rods for the semiconductor industry by either the float-zone melting process or by the Czochralski crystal-pulling technique. The single crystal rods are further processed to form silicon wafers from which semiconductor silicon chips are made.

Polycrystalline rods are made by the pyrolytic decomposition of a gaseous silicon compound, such as silane, on a heated rod shaped silicon filament or, alternatively, from a high melting point metal having good electrical conductivity, such as tungsten or tantalum. The principles of the design of present state-of the-art reactors for the pyrolysis of silane are set forth in, for example, U.S. Pat. Nos. 3,147,141, 4,147,814, 4,150,168.

The pyrolysis of silane to form silicon and hydrogen is performed in a reactor housing a plurality of silicon filament rods. The silicon filament seed rods are electrically heated until red hot to react with silane gas fed slowly into the reactor. The process is started with the silicon filament seed rod at ambient temperature. Since pure silicon has very high electrical resistivity, the seed rod is doped with impurities to lower its electrical resistivity, thereby facilitating the start of the heating process.

The build up of polycrystalline silicon is the result of the heterogeneous decomposition of silane on the glowing hot surface of the silicon filament seed rod. The reaction deposits silicon on the surface of the filament rod and releases hydrogen gas which flows by the natural thermal convective transport of the resulting silane/hydrogen mixture in the reactor. This natural thermal convection is created by the hydrogen being heated by the hot silicon rod causing it to rise at a modest velocity estimated at about 5 feet/sec and then cooled by the reactor walls whereupon it flows downward at a reduced velocity.

The silane pyrolysis proceeds at a rate determined by the concentration of monosilane in its gaseous phase and local temperature. Desirable formation of dense crystalline silicon occurs in a narrow boundary layer surrounding the hot silicon rod. To the extent that the bulk gas temperature is high enough to cause pyrolysis, a competing homogeneous silane decomposition reaction takes place wherein deleterious submicron powder is formed. In practice, it is found that this powder formation increases with increasing rod diameter.

Although much of the powder particles are deposited on the cold reactor walls by thermophoretic decomposition, the number of powder particles eventually build up to intolerable levels. Also, some of this powder ultimately deposits directly onto the silicon rod or, alternatively, flakes of deposited powder fall from the reactor walls onto the product. This affects both the surface morphology of the rod and causes undesirable contamination due the incompatible melting behavior of the powdered silicon during subsequent single crystal formation techniques. If the powder concentration is sufficiently high, the surface morphology and/or the processability of the resulting silicon rod deteriorates to the point where the product becomes totally unacceptable.

Accordingly, the formation of silicon powder by homogeneous decomposition effectively places an upper limit on the diameter and/or growth rate of the rods that may be grown during any production run, although larger rods and/or higher growth rates would clearly be more cost effective. Once the amount of powder deposited on the reactor walls is such that it appears imminent that it is about to flake off, the reaction must be stopped so as to prevent contamination. So too, while it is known that increasing the silane concentration within the reactor will effect a higher growth rate of the silicon rod, the concomitant production of silicon powder negates any advantage that such increased growth rate may have.

This limited capability of the reactors translates into low productivity per reactor, a large consumption of electrical power per unit of production and a large capital investment per annual unit of capacity. While the fraction of silane decomposing homogeneously into fine powder is small compared to the fraction decomposing heterogeneously into useful product, it is clear that the formation of even this relatively small amount of powder is quite detrimental and necessitates a need for finding a way to improve reactor productivity and efficiency.

In a copending application U.S. Ser. No. 062,256 commonly assigned to the same assignee, it was discovered that by discharging the gases generated in the reactor and recycling the exhaust gas back into the reactor at a rate high enough to entrain silicon powder, the silicon powder may be filtered out from the external loop before the exhaust gas is returned to the reactor. This permits more silane to be introduced in the reactor to increase the silane decomposition without increasing the concentration of silicon powder in the reactor.

SUMMARY OF THE INVENTION

It has now been discovered that the method of reintroducing the exhaust gas back into the reactor and the flow distribution of the gas in the reactor is a critical factor if the gas is to be recycled for producing uniform polycrystalline growth with high quality surface morphology. Moreover, the method and design of the reactor in accordance with the present invention permits substantially increased rates of production to be realized without limitation in rod diameter size other than for practical reasons.

A reactor system for pyrolyzing silane to form a high-purity polycrystalline silicon rod of uniform diameter independent of diameter size has been developed in accordance with the present invention comprising:

a base member;

a shell for covering said base member to form an enclosure within said reactor;

a plurality of filament starter rods vertically disposed within said enclosure in a spaced apart relationship;

means for introducing silane gas into said enclosure;

means for heating each starter rod to a predetermined temperature to initiate the heterogeneous decomposition of silane for depositing silicon upon each rod;

means for forming an elongated chamber substantially surrounding each filament rod with each chamber having a longitudinal axis substantially concentric with each rod and a bottom end extending below each starter rod;

means for recycling gas from said enclosure to filter out silicon powder; and means for reintroducing the recycled gas into each chamber formed in said enclosure from the bottom thereof.

The present invention also includes a method for producing high purity polycrystalline rods in a reactor vessel in which silicon is deposited upon a plurality of heated filament silicon starter rods vertically disposed within said reactor vessel in a spaced apart relationship comprising:

substantially confining each filament rod within an elongated chamber extending vertically upright with each chamber having an open bottom end and a longitudinal axis substantially concentric with each rod;

recycling gas exhausted from the vessel to filter out silicon powder;

feeding the recycled gas separately into each chamber from the bottom end thereof with the recycled gas being substantially directed at the longitudinal axis of the chamber.

OBJECTS AND BRIEF DESCRIPTION OF DRAWINGS

It is the principle object of the present invention to provide a method and reactor for forming high quality polycrystalline silicon rods of any desired uniform size diameter at relatively high rates of production.

This and other objects and advantages of the present invention will become apparent from the following detailed description of the invention when read in conjunction with the accompanying drawings of which:

DESCRIPTION OF THE PREFERRED EMBODIMENT

Figure 1:
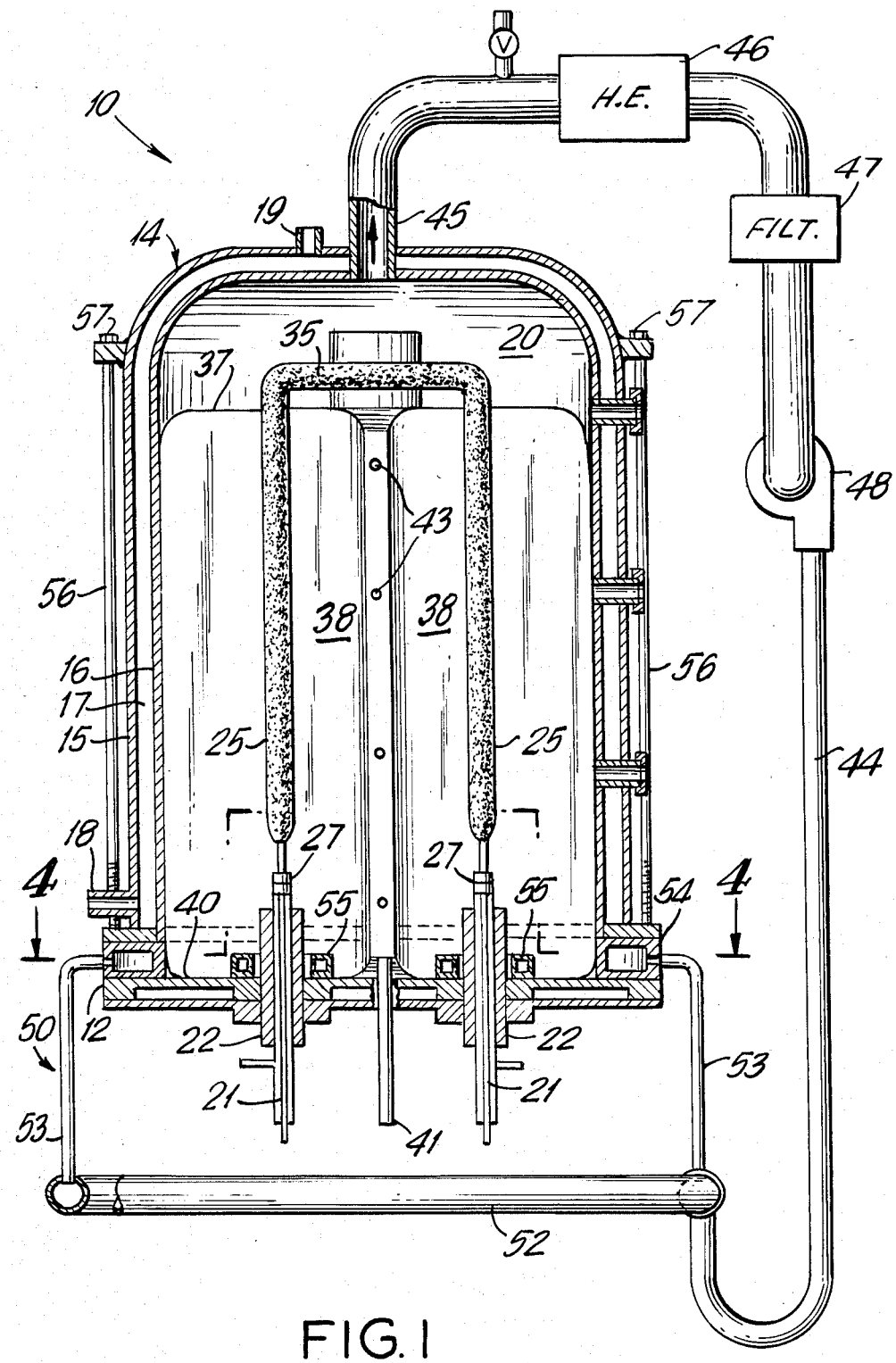
FIG. 1 is a side elevation of the reactor of the present invention shown partly in section.
Figure 2:
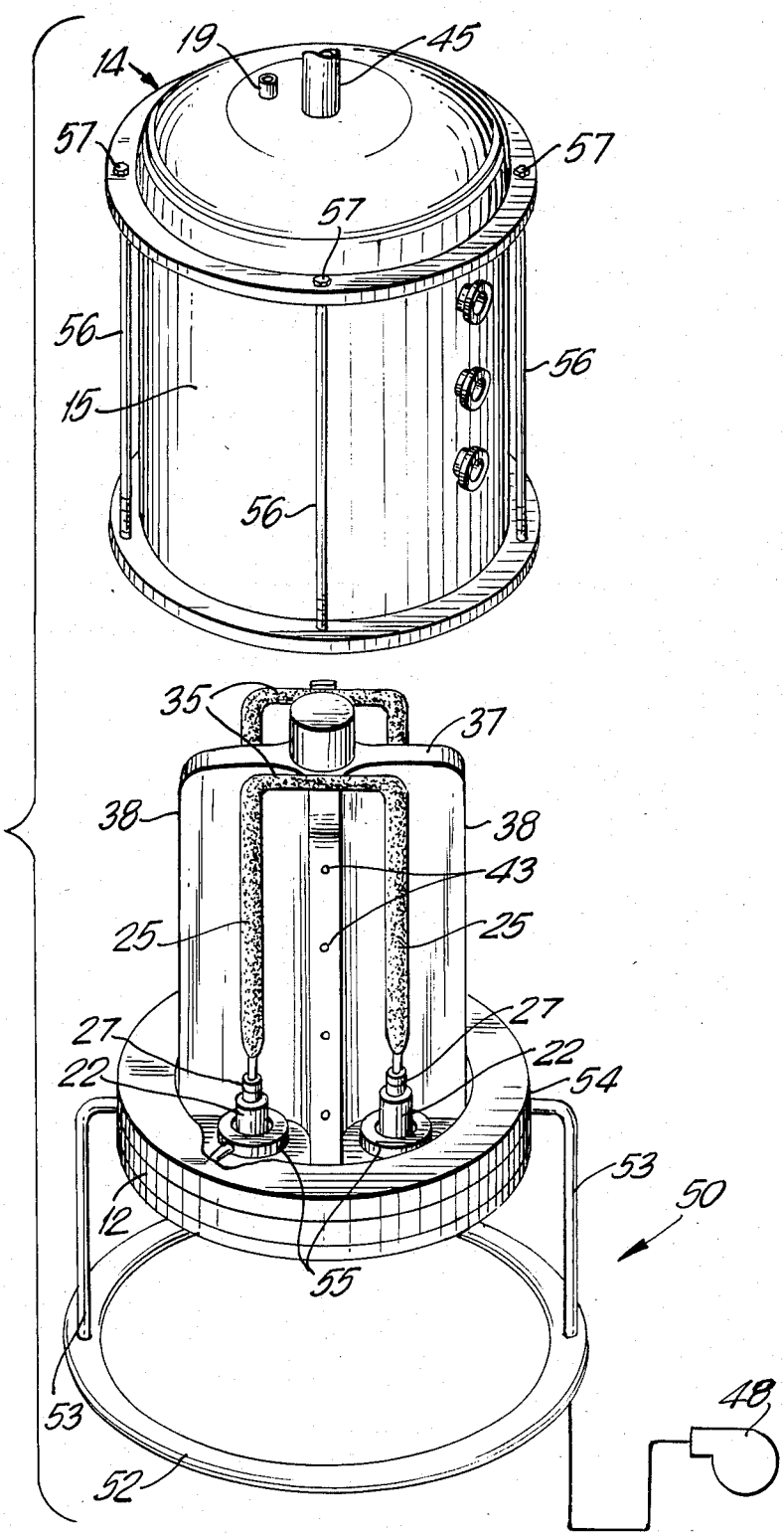
FIG. 2 is a perspective view of the reactor of FIG. 1 showing the cover lifted off the reactor.

The reactor 10 of the present invention has an elliptical cross sectional geometry as shown in FIGS. 1 and 2 and comprises a base member 12 upon which is fixedly mounted a shell 14 having a belljar configuration with a double wall construction defined by an outer wall 15 and an inner wall 16. The outer and inner walls are spaced apart from each other to form a clearance 17. A coolant such as water is passed through an inlet port 18 in wall 15 into the clearance space 17 and exits from an exit port 19. The shell 14 and base member 12 form an enclosure 20 within the reactor 10 for performing a pyrolosis operation in accordance with the present invention.

An array of electrodes 21 are mounted in the enclosure 20 in a symmetrical arrangement with each electrode being substantially equidistant from one another and from the center of the reactor 10. Each electrode 21 is vertically mounted in a thermal shield 22 affixed to the base member 12. For purposes of simplicity in understanding the invention only four electrodes 21 have been selected to be shown in the drawings as representative of the electrode array. For a commercial operation a substantially larger number of electrodes are preferred. A silicon starter rod 25 is mounted upon each electrode 21. The array of electrodes 21 should consist of an even number connected to a corresponding even number of starter rods 25. Each silicon starter rod 25 is spaced a substantially equal distance apart and is radially separated from the inner wall 17 of the cover 14 by a substantially equal distance.

Each of the electrodes 21 extend below the base member 12 where each is connected to a conventional AC source of power (not shown). A disposable carbon chuck 27 is mounted on the upper end of each electrode 21 in contact with each starter rod 25. The carbon chuck 27 simplifies the removal of the finished silicon rods from the reactor 10 after the pyrolosis operation is complete. The silicon rods 25 are also held in a substantially vertical orientation relative to the base member 12.

An electric circuit is completed between each set of two silicon rods 25 through a connector 35 preferably of the same composition as the rods 25. The silicon rods 25 are preferably formed in pairs with each pair having a horseshoe-like configuration with the bridging section representing the connector 35. In this way each horseshoe-like pair of rods 25 complete an electric circuit through the electrodes 21 in which the rods 25 are mounted.

A high purity uniform deposit of polycrystalline silicon is formed on each upright silicon feed rod 25 in accordance with the present invention. Although polycrystalline silicon will also deposit on each connector 35 bridging each set of silicon rods 25 the deposit along this section is not as uniform and the surface morphology is poorer.

A thermal insulator 37 is mounted upon the base member 12 to provide thermal insulation for each rod in a conventional fashion. The thermal insulator 37 is also used in accordance with this invention as a means for controlling the flow of recycle gas around each rod. The thermal insulator 37 is vertically mounted upon or supported by the base member 12 and includes partitioning walls 38 which extend on opposite sides of each starter rod 25 to form an elongated chamber 40 substantially surrounding each rod 25. The chambers 40 operate to guide the distribution of recycled gas uniformly around each rod 25 as will be explained in greater detail hereinafter. The rod 25 preferably lies in the symmetrical center of each chamber 40. The partitioning walls 38 may be mounted directly upon the base member 12 or mounted relatively close thereto and extend vertically up as close as possible to the connector 35 bridging the silicon rods 25.

Monosilane gas is introduced into the reactor 10 through a supply pipe 41 which extends through the base member 12 and the core of the thermal insulator 37 to a plurality of outlets 43. Alternatively, the monosilane gas can be introduced into the recycle gas supply pipe 44 before it reenters the reactor 10.

Exhaust gas is withdrawn from the reactor 10 through an exit port 45. The exhaust gas is fed past a heat exchanger 46, a filter 47 and into a blower 48 whereupon it is recycled back through the supply pipe 44 into the reactor 10 at a controlled flow rate. A valve V is connected in the exhaust line preferably adjacent the exit port 45 to allow a portion of the exhaust gases to be vented to provide for the recovery of silane and removal of excess hydrogen formed by the decomposition of silane. The heat exchanger 46 serves to cool the exhaust gases down to a temperature in a range of about 50° to about 300° C. so as to control the reentry temperature into the reactor 10. The filter 47 serves to remove entrained silicon powder present in the exhaust gases. The heat exchanger 46, filter 47 and blower 48 are all conventional equipment. The flow rate of the recycled gas is optimized to remove silicon powder contained in the exhaust gas and to promote the rate at which the heterogeneously formed silicon deposits on each silicon rod 25. Accordingly the flow rate may be as large as is practical based upon the production of polycrystalline silicon.

Figure 3:
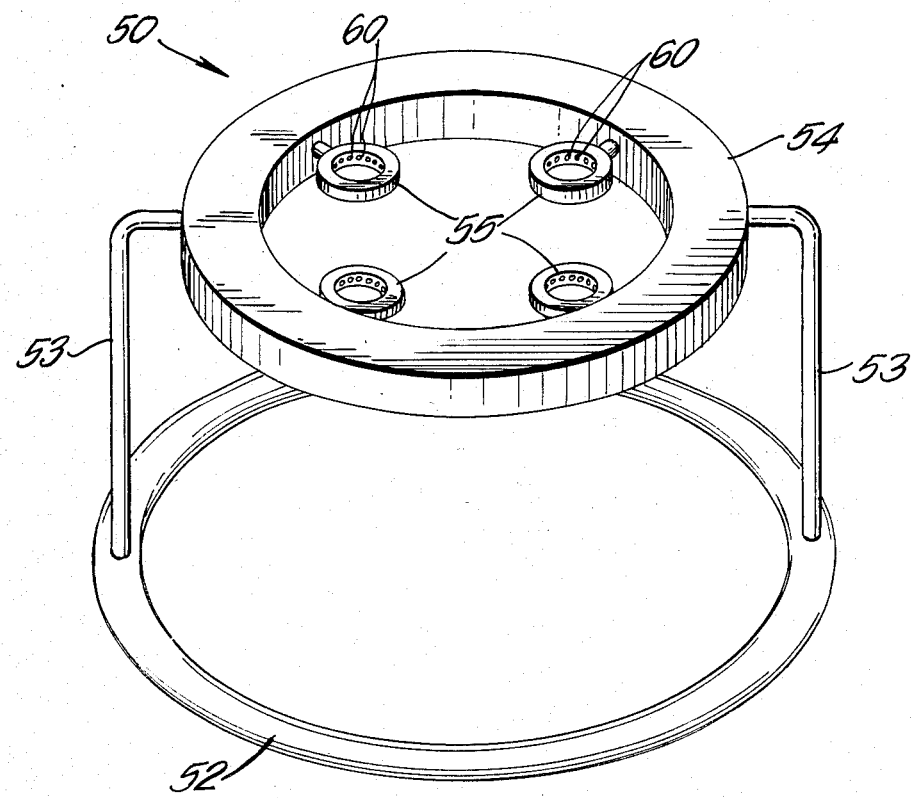
FIG. 3 is a perspective view of the distributor manifold assembly for introducing recycled gas back into the reactor of FIG. 1.
Figure 4:
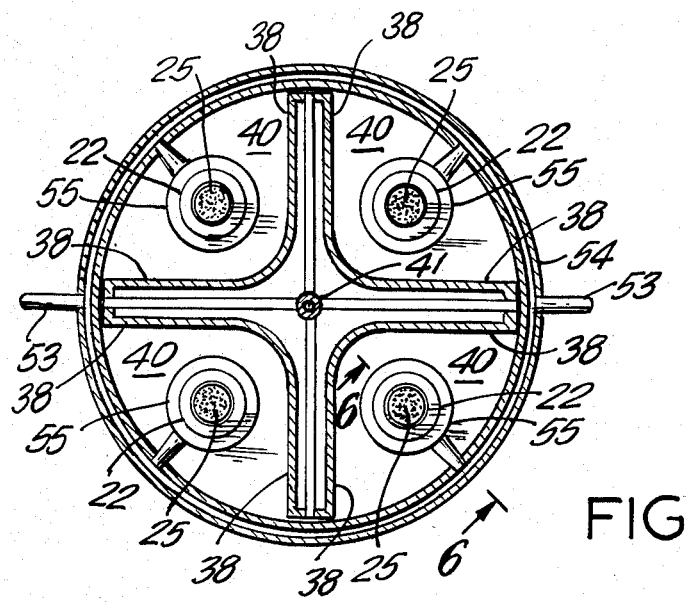
FIG. 4 is a plan view taken along the lines FIG. 4—4 of FIG. 1.
Figure 5:
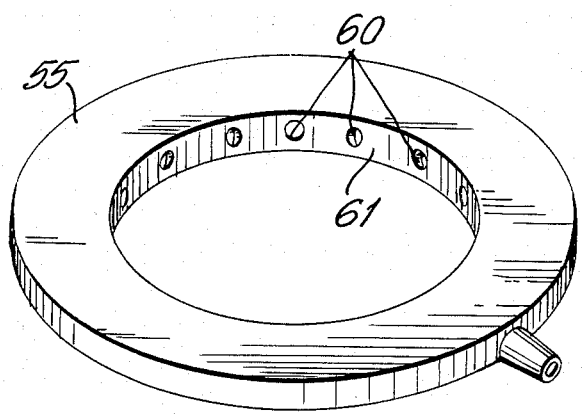
FIG. 5 is a perspective view of the distributor ring surrounding each of the electrode assemblies of FIG. 1.
Figure 6:
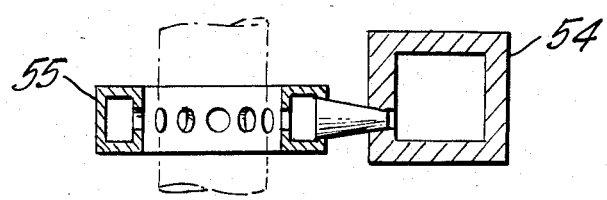
FIG. 6 is a plan view taken along the lines 6—6 of FIG. 4.

The recycled exhaust gases are driven by the blower 48 through a distribution network 50 into the reactor 10 The distribution network 50 as is more clearly shown in FIGS. 2 and 3 distributes the recycled gas in a controlled manner to cause uniform growth of the polycrystalline silicon. The distribution network 50 includes a manifold 52, feeder lines 53, a secondary manifold 54 and a plurality of distribution rings 55. The manifold 54 is mounted upon the base member 12. The shell 14 is seated upon the manifold 54 and includes a plurality of ear like ribs 56 projecting from the shell 14 with mounting screws 57 extending therethrough for attaching the shell 14 to the base member 12.

The number of distributor rings 55 correspond in number to the number of silicon rods 25 with each distributor ring 55 mounted below a silicon rod 25 and preferably at a level surrounding the corresponding electrode 21 connected to such silicon rod 25.

Each distributor ring 55 has a toroid like geometry with a multiple number of discharge openings 60 symmetrically distributed around the inside surface 61 of the toroid to direct the recycled gas substantially at the longitudinal axis of each chamber 40 in the direction of the electrode 21. This causes the recycle gas to move upwardly with a uniform flow pattern having velocity vectors evenly distributed along an axial plane surrounding each rod 25.

The first manifold 52 in the distribution network 50 converts the turbulent high velocity gas driven by the blower 48 to a more uniform flow. The second manifold 54 redistributes the gas equally into the distributor rings 55 which in turn discharges the gas uniformly into each chamber 40. Thus, the distribution network 50 permits the gas to be recycled at any desired flow rate without affecting the uniformity in polycrystalline growth along the length of the silicon rod 25.

What we claim is:

1. A reactor system for pyrolyzing silane to form a high-purity polycrystalline silicon rod of uniform diameter substantially independent of diameter size comprising:
    a base member;
    a shell for covering said base member to form an enclosure within said reactor;
    an array of filament starter rods vertically disposed within said enclosure in a substantially symmetrical spaced apart relationship;
    means for introducing silane feed gas into said enclosure;
    means for heating each starter rod to a predetermined temperature to initiate the heterogeneous decomposition of silane for depositing silicon upon each rod;
    means for forming an elongated chamber about each filament rod with each chamber extending below each starter rod;
    means for recycling exhaust gas from said reactor back into said enclosure such that at least part of the recycle stream is reintroduced separately from the silane feed gas; and
    means for directing said recycled gas into each chamber surrounding each electrode at one end thereof and at a level below each starter rod.

2. A reactor system as defined in claim 1 wherein said means for reintroducing the recycle gas back into the reactor system comprises a distribution network having at least one manifold and a plurality of distributor rings corresponding to the number of filament starter rods with each distributor ring connected to said manifold.

3. A reactor system as defined in claim 2 wherein each distributor ring has a multiple number of outlet orifices in a symmetrical annuler arrangement.

4. A reactor system as defined in claim 3 wherein each distributor ring is disposed about an electrode located below each filament starter rod with said orifices aligned to direct the recycle gas at the electrode.

5. A reactor system as defined in claim 4 wherein each distributor ring has a toroid like shape with the surface containing the outlet orifices symmetrically surrounding the electrode with each orifice equidistant from said electrode.

6. A reactor system as defined in claims 3 or 5 wherein said distribution network includes two manifolds with a first manifold connected to a gas supply pipe for recycling said exhaust gas, a second manifold connected to said distributor rings and at least one gas feeder line for connecting the first manifold to said second manifold.

* * * * *